United States Patent [19]

Miller

[11] Patent Number: 4,857,985
[45] Date of Patent: Aug. 15, 1989

[54] MOS IC REVERSE BATTERY PROTECTION

[75] Inventor: William E. Miller, Los Gatos, Calif.

[73] Assignee: National Semiconductor Corporation, Santa Clara, Calif.

[21] Appl. No.: 285,290

[22] Filed: Dec. 15, 1988

Related U.S. Application Data

[63] Continuation of Ser. No. 91,266, Aug. 31, 1987, abandoned.

[51] Int. Cl.⁴ .............................................. H01L 27/02
[52] U.S. Cl. .................................... 357/42; 357/48; 361/82; 361/100; 361/246; 307/304
[58] Field of Search .................... 357/42, 48; 361/82, 361/100, 246; 307/304, 127; 363/127

[56] References Cited

U.S. PATENT DOCUMENTS

| | | | |
|---|---|---|---|
| 3,940,785 | 2/1976 | Genesi | 357/48 |
| 4,139,880 | 2/1979 | Ulmer et al. | 361/246 |
| 4,303,958 | 12/1981 | Allgood | 357/42 |
| 4,473,757 | 9/1984 | Farago et al. | 357/42 |

Primary Examiner—Martin H. Edlow
Attorney, Agent, or Firm—Limbach, Limbach & Sutton

[57] ABSTRACT

A field effect transistor has its drain and source regions connected between one of the two supply pads of an operative integrated circuit, the gate of the field effect transistor being connected to the other pad such that the gate is negatively biased during reverse battery to prevent current flow through the circuit in this condition and, hence, to prevent destruction of the circuit. The FET is sized to have minimal voltage drop during normal, forward battery operation of the circuit. The FET can be implemented as either an N-channel or a P-channel device.

4 Claims, 2 Drawing Sheets

MOS IC REVERSE BATTERY PROTECTION

This is a continuation of co-pending application Ser. No. 091,266, filed on Aug. 31, 1987, now abandoned.

BACKGROUND OF THE INVENTION

1. Field of the Invention

The present invention is directed to circuitry for protecting an MOS integrated circuit from destructive currents under reverse battery conditions.

2. Discussion of the Prior Art

FIGS. 1A and 1B illustrate a simple conventional, junction-isolation, N-well CMOS circuit with its associated PN junction diodes. In a reverse battery situation, e.g. when the batteries are inadvertently placed in an electronic device in reverse polarity, the normally-positive $V_{DD}$ supply pad becomes the negative supply and the normally-negative $V_{SS}$ supply pad becomes the positive supply. Under this condition, the diodes associated with the circuit are forward biased, the current from the battery through the circuit becomes very large and the circuit is destroyed.

FIG. 2 illustrates the same prior art circuit which is implemented utilizing P-well technology.

The conventional solution to the reverse battery problem is to provide either a large external resistor or an external diode in series with the $V_{DD}$ supply pad to prevent large currents from flowing through the circuit during reverse battery. However, use of these external devices creates a large voltage drop across the device during normal operation of the circuit. This complicates circuit design. Furthermore, integration of a protective resistor does not solve the voltage drop problem and integration of a protective diode creates parasitics within the circuit.

SUMMARY OF THE INVENTION

The present invention provides a solution to the above-described reverse battery problem by placing a large MOS field effect transistor between the operative circuit and one of the two supply pads of the circuit. The gate of the field effect device is connected to the other supply pad. The body of the field effect transistor is connected to the source/drain node which is connected to the operative circuit.

Thus, according to one embodiment of the invention, an N-channel device has its drain and source regions connected between the circuit to be protected and the circuit's $V_{SS}$ pad. The gate of the N-channel device is connected to the circuit's $V_{DD}$ pad. Thus, the N-channel device is connected so that, in a forward battery condition, it is turned on as hard as possible by applying the $V_{DD}$ positive supply to its gate. The device's $V_{BS}$ is slightly positive to lower its threshold voltage and its w/L is designed so that only $V_{DS}=0.1$ volt occurs under peak chip current. In a reverse battery condition, the gate of the N-channel device is biased negative and its diodes are off, preventing current flow through the circuit.

Alternatively, instead of utilizing an N-channel device as described above, a P-channel device can be similarly utilized by connecting its drain and source regions between the operative circuit and the $V_{DD}$ pad. The gate of the P-channel device is connected to the $V_{SS}$ pad.

These and other objects, advantages and features of the reverse battery protection circuitry of the present invention will be better understood and appreciated by reference to the detailed description of the invention provided below which should be considered in conjunction with the accompanying drawings.

DETAILED DESCRIPTION OF THE INVENTION

Figure 1A:
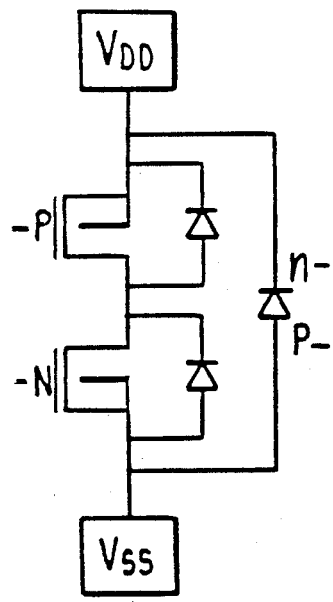
FIG. 1A is a simple schematic diagram illustrating a conventional CMOS circuit.
Figure 1B:
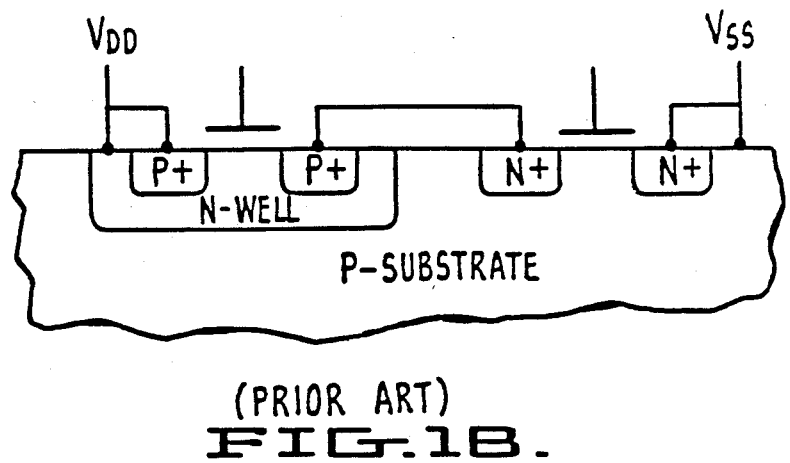
FIG. 1B is s cross-sectional view illustrating the circuit shown in FIG. 1A implemented in N-well technology.
Figure 2:
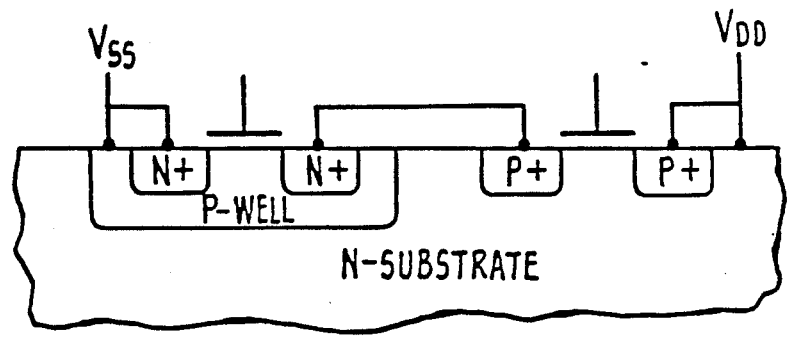
FIG. 2 is a cross-sectional view illustrating the circuit shown in FIG. 1A implemented in P-well technology.
Figure 3A:
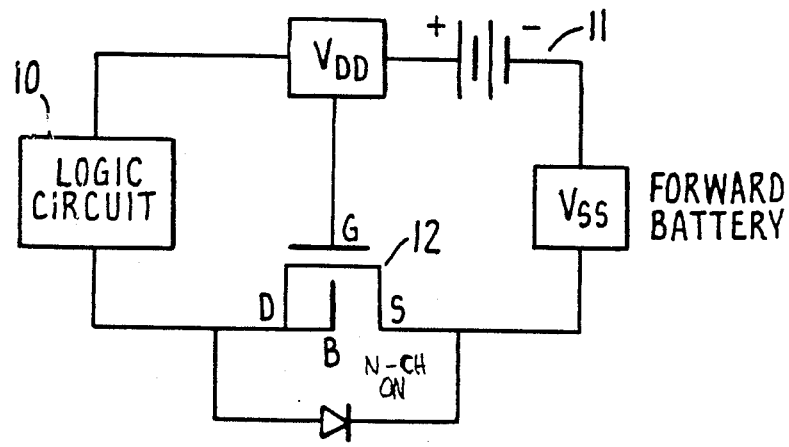
FIG. 3A is a schematic diagram illustrating the inclusion in the FIG. 1A circuit of an N-channel protective device in a forward battery condition.

FIG. 3A shows an operative logic circuit 10 connected between a $V_{DD}$ supply pad and a $V_{SS}$ supply pad. Under normal operating conditions, as illustrated in FIG. 3A, a battery 11 is forward connected so that the $V_{DD}$ pad provides the positive supply and the $V_{SS}$ pad is the negative connection to the circuit 10.

In accordance with the present invention, a protective N-channel field effect transistor 12 has its drain and source regions connected between the operative circuit 10 and the $V_{SS}$ pad, the gate of the N-channel device 12 being connected to the $V_{DD}$ pad. The w/L of device 12 is designed so that only $V_{DS}=0.1$ volt occurs under peak chip current. In the typical embodiment, the w/L is approximately 8000/4. The $V_{BS}$ of device 12 is slightly positive to lower its threshold voltage. Thus, as illustrated in FIG. 3A, in a forward battery condition, the positive supply at the $V_{DD}$ pad turns device 12 on as hard as possible so that there is minimal voltage drop across device 12.

Figure 3B:
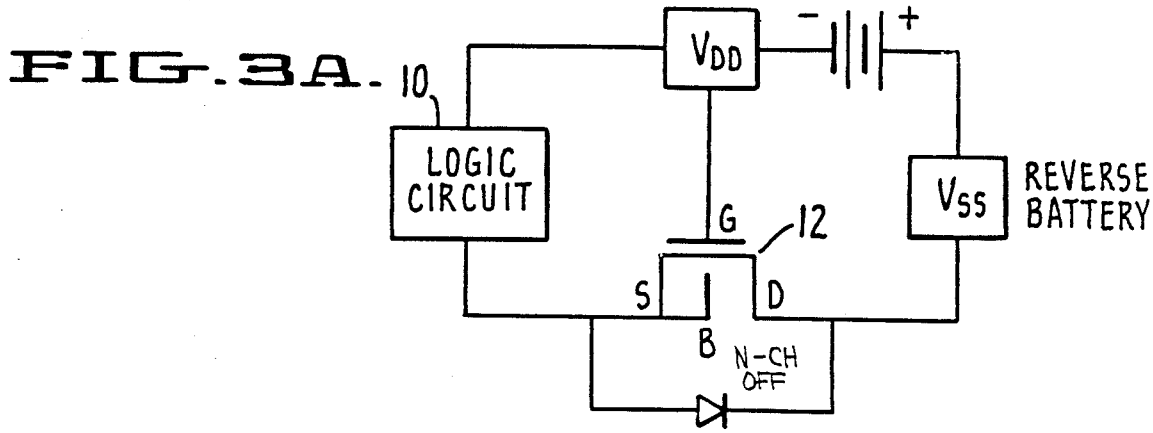
FIG. 3B is a schematic diagram illustrating the FIG. 3A circuit in a reverse battery condition.

However, as shown in FIG. 3B, in a reverse battery condition, i.e. when the the polarity of the battery is reversed so that the $V_{SS}$ pad provides the positive supply, the gate of device 12 is biased negative and the diodes are off. This prevents current from flowing through the logic circuit 10. In this manner, the logic circuit 10 is protected from excessive destructive current in a reverse battery condition.

The circuit described in conjunction with FIGS. 3A and 3B operates much better than placing an integrated diode or resistor in series with the $V_{DD}$ pad, since the forward bias voltage drop of these devices is approximately 0.6V, while the $V_{DS}$ of the transistor 12 can be less than 0.1V.

As shown in FIGS. 3A and 3B, the N-channel device 12 is configured in a unique, non-conventional manner with its body connected to its drain in the forward battery condition.

Figure 4A:
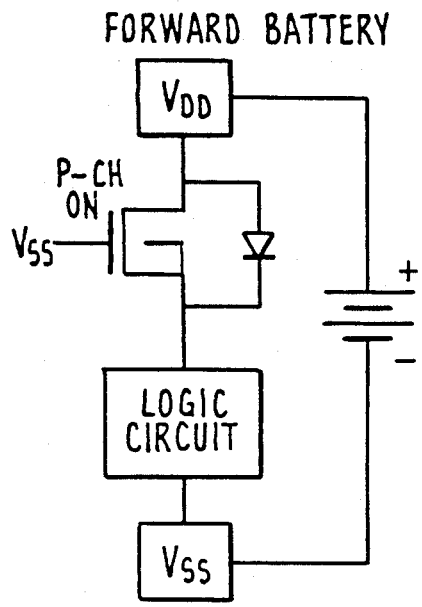
FIG. 4A is a schematic diagram illustrating the inclusion in the FIG. 2 circuit of a P-channel protective device in a forward battery condition.
Figure 4B:
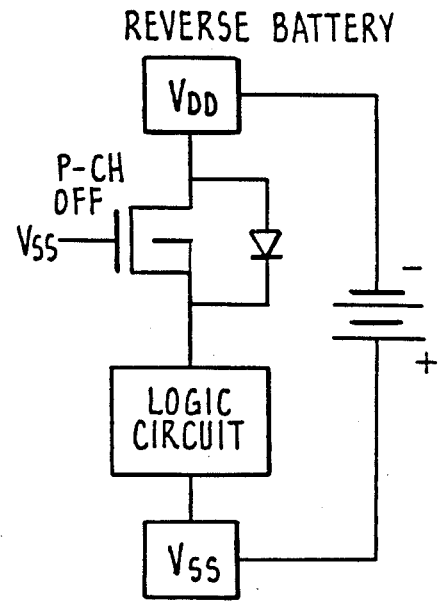
FIG. 4B is a schematic diagram illustrating the FIG. 4A circuit in a reverse battery condition.

The solution illustrated in FIGS. 3A and 3B will work equally well for either N-well or P-well technology. Thus, as illustrated in FIGS. 4A and 4B, a P-channel device can also be used to provide reverse battery protection.

The choice of whether a P-channel or a N-channel reverse battery protection transistor is used depends upon a number of factors: the simultaneous total maximum output sink current and $V_{OH}$ required, the simultaneous total maximum output source current and $V_{OL}$ required, the input voltage level low required, and the input voltage level high relative to $V_{DD}$ required. The protective transistor's $V_{DS}$ will make $V_{OL}$ and $V_{IL}$ more difficult to meet if an N-channel device is selected. $V_{OH}$ and $V_{IH}$ will be more difficult to meet if a P-channel device is selected. In most applications, an N-channel device will be preferred because the device size required is smaller.

The use of an integrated transistor provides advantages over the conventional external solutions because the protective transistor can be sized to drop very little voltage under normal operation and is implemented at low cost as compared to external components.

It should be understood that various alternatives to the embodiment of the invention described herein may be employed in practicing the invention. It is intended that the following claims define the scope of the invention that structures within the scope of these claims and their equivalents be covered thereby.

I claim:

1. In an integrated circuit which includes a power supply pad and a ground pad, one or more operative circuits to be protected from reverse voltage being connected between the power supply pad and the ground pad via a power supply distribution bus and a ground supply distribution bus, and wherein, under normal operating conditions, a battery is connected between the power supply pad and the ground pad such that the power supply pad provides a positive supply voltage to said operative circuit or circuits to be protected from reverse voltage, the improvement comprising a MOS field-effect transistor having its drain and source regions connected between said operative circuit or circuits to be protected from reverse voltage and one of the pads, the gate of the field effect transistor being connected to the other pad such that the gate of the field effect transistor is turned off during a reverse battery condition, the body of the field-effect transistor being connected to the source/drain node which is connected to said operative circuit or circuits to be protected from reverse voltage, preventing current flow through said operative circuit or circuits to be protected from reverse voltage.

2. The integrated circuit according to claim 1 wherein the field effect transistor has a voltage drop across it of about 0.1 volts during maximum current flow through said operative circuit or circuits to be protected from reverse voltage in a forward battery condition.

3. The integrated circuit according to claim 1 wherein the field effect transistor is an N-channel device having its drain and source connected between said operative circuit or circuits to be protected from reverse voltage and the ground pad, and in series between the ground pad and the ground supply distribution bus, its gate connected to the power supply pad, and its body connected to the source/drain node which is connected to said operative circuit or circuits to be protected from reverse voltage.

4. The integrated circuit according to claim 1 wherein the field effect transistor is a P-channel device having its drain and source connected between said operative circuit or circuits to be protected from reverse voltage and the power supply pad, and in series between the power supply pad and the power supply distribution bus, its gate connected to the ground pad, and its body connected to the source/drain node which is connected to said operative circuit or circuits to be protected from reverse voltage.

* * * * *